US005198728A

United States Patent [19]

Bernitz et al.

[11] Patent Number: 5,198,728

[45] Date of Patent: Mar. 30, 1993

[54] OPERATING CIRCUIT FOR A DISCHARGE LAMP

[75] Inventors: Franz Bernitz, Unterhaching; Frank Hansmann, Barsinghausen; Andreas Huber, Maisach, all of Fed. Rep. of Germany

[73] Assignee: Patent-Treuhand Gesellschaft fur fur elektrische Gluhlampen mbH, Munich, Fed. Rep. of Germany

[21] Appl. No.: 808,665

[22] Filed: Dec. 17, 1991

[30] Foreign Application Priority Data

Jan. 24, 1991 [DE] Fed. Rep. of Germany ....... 4102069

[51] Int. Cl.[5] ............ H03B 41/36

[52] U.S. Cl. ............ 315/307; 315/291

[58] Field of Search ........... 315/307, 308, 224, 209 R, 315/291, 297, DIG. 7, DIG. 5

[56] References Cited

U.S. PATENT DOCUMENTS

| | | | |
|---|---|---|---|
| 3,999,100 | 12/1976 | Dendy | 315/308 |
| 4,523,128 | 6/1985 | Stamm | 315/291 |
| 4,952,849 | 8/1990 | Fellow | 315/308 |
| 4,958,106 | 9/1990 | Hendrix | 315/307 |
| 4,958,108 | 9/1990 | Jorgensen | 315/307 |
| 5,048,033 | 9/1991 | Donahue | 315/307 |
| 5,051,666 | 9/1991 | Jensen | 315/307 |
| 5,068,572 | 11/1991 | Blankers | 315/209 R |
| 5,097,181 | 3/1992 | Kakitani | 315/209 R |

FOREIGN PATENT DOCUMENTS

| | | |
|---|---|---|
| 0228123 | 7/1987 | European Pat. Off. . |
| 0350104 | 1/1990 | European Pat. Off. . |
| 0445882 | 9/1991 | European Pat. Off. . |

OTHER PUBLICATIONS

"The Art of Electronics" by P. Horowitz and W. Hill, Cambridge University Press, Cambridge, 1980.
Journal of the Illuminating Engineering Society, vol. 17, No. 2, Summer 1988.
"Switched-Mode Power Supplied (SMPS)" by Siemens Aktiengesellschaft Bereich Bauelemente.

*Primary Examiner*—Eugene R. LaRoche
*Assistant Examiner*—A. Zarabian
*Attorney, Agent, or Firm*—Frishauf, Holtz, Goodman & Woodward

[57] ABSTRACT

A switched mode power supply (SNT) is coupled to a source of d-c energy ($U_{Batt}$) and provides electrical energy to a lamp within widely varying limits. The switching conditions of the switched mode power supply are controlled by an operation control circuit (ADD) which has a current sensing resistor, serially connected to the lamp, to provide a lamp current signal, and a voltage divider (R2, R3) connected across the lamp to sense lamp voltage and provide a lamp voltage signal. The lamp current signal and the lamp voltage signal are added, compared in a comparator formed by an operational amplifier (IC2-A), with respect to a reference setting power level, and the output signal from the comparator is coupled back to the switched mode power supply to control the switching rate thereof, based on the instantaneous lamp current and lamp voltage. Excess voltage can be compensated by providing either an active semiconductor switching network (T1, T2, FIG. 3) or a passive semiconductor switch (ZD), which affects the added current-voltage signal applied to the comparator (IC2-A).

12 Claims, 4 Drawing Sheets

OPERATING CIRCUIT FOR A DISCHARGE LAMP

FIELD OF THE INVENTION

The present invention relates to an operating circuit for a discharge lamp, and more particularly to such an operating circuit for a discharge lamp which provides the discharge lamp with effectively constant electrical energy so that the lamp will operate at at least approximately effective constant power.

BACKGROUND

Operating circuits for discharge lamps are known, which include a switched mode power supply which is coupled to a source of d-c energy, which may be supplied by a battery or, for example, by a rectifier from a power supply network. The voltage of the d-c energy source may vary. The switched mode power supply delivers d-c output energy changeable within wide limits; the d-c output power can be changed by an inverter circuit to a-c output if the lamp is to operate under alternating current conditions, or can be left as direct current if the lamp operates with direct current energy. An ignition circuit to start ignition of the lamp is interposed between the switched mode power supply and the inverter circuit or the lamp, respectively.

THE INVENTION

It is an object to provide an operating circuit for the discharge lamp which is simple and can be made cheaply, and which permits operation of the lamp at effectively constant electrical power. Preferably, the circuit should also be self-protecting so that, in case of short circuit at the lamp or lamp terminals, or in case of excessive voltage, the control circuit automatically limits current supply and/or voltage to the lamp.

Briefly, the operating circuit includes an operation control circuit which has power sensing elements, for example a current dropping resistor in circuit with the lamp, and a voltage divider across the supply to the lamp, so that a combined signal can be derived representative of current and voltage, that is power supplied to the lamp. This combined power supply signal is compared in a comparator, for example an operational amplifier, with a reference signal, typically a reference voltage, to derive a comparison control signal. The comparison control signal is then fed or supplied to the switched mode power supply to control the switching conditions thereof, for example the switching frequency, duty cycle and the like, in accordance with the comparison control signal.

The system can be easily constructed and, additionally, automatically controls energy supplied to the lamp in case of short circuit or excessively high voltages.

The operating range within which lamp power supply is approximately constant can be extended by use of a second operational amplifier, connected as a comparator, and which can switch the operating point in dependence on lamp voltage. Differences in lamp voltage, due to the physical construction of the lamp, or which result from aging of the lamp and use, can be sensed and compensated. The circuit permits limitation of deviation of electrical power at the discharge lamp from a command or desired value to between ±1%. High stability with respect to temperature variations can readily be obtained. A Zener diode can be included in the circuit, connected in parallel to a voltage divider which senses the lamp voltage. The Zener diode expands the working range of the circuit, so that, likewise, variations in range of the lamp arc voltage due to aging or tolerances in manufacture can be compensated. The Zener diode has the additional and important advantage that the elements used are inexpensive and the circuitry simple, while compensating for aging and manufacturing tolerances. The deviation of electrical power of the discharge lamp from its command or desired value, in this embodiment, will be only about ±2% within the working range of the lamp.

DRAWINGS

DETAILED DESCRIPTION

Figure 1:
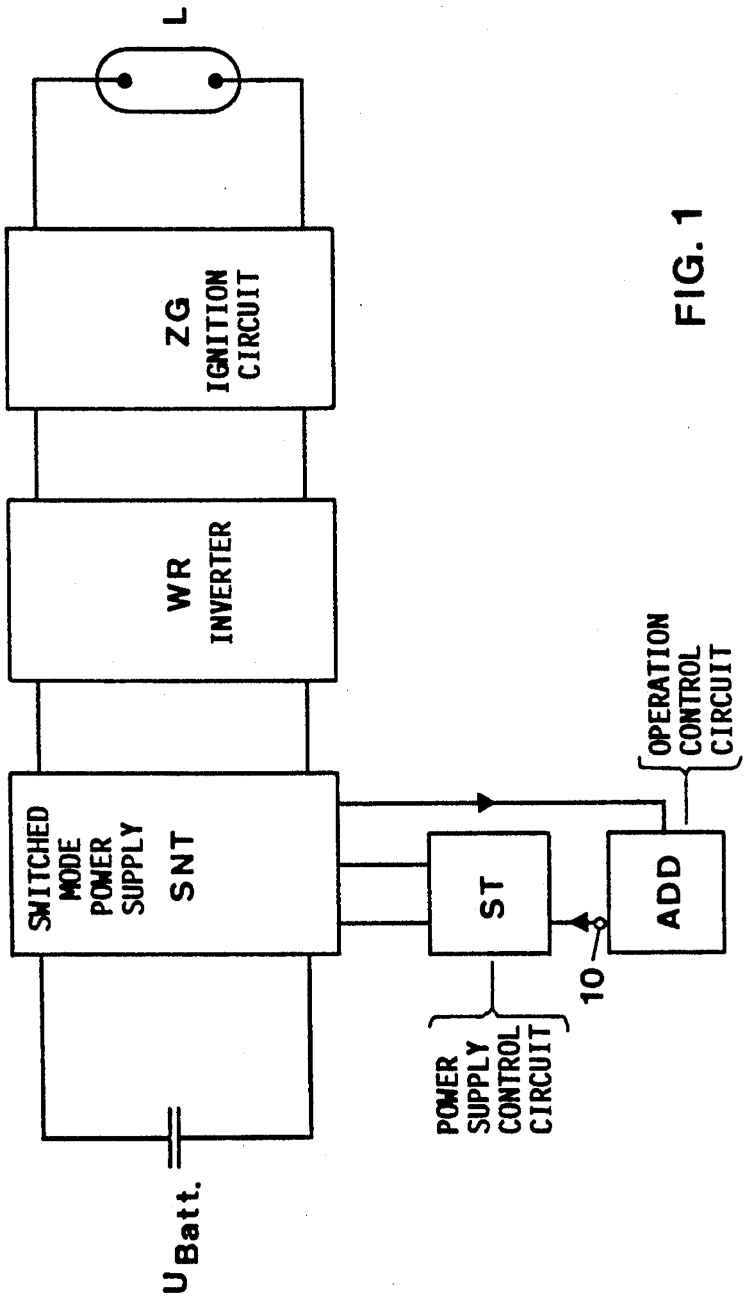
FIG. 1 is a general schematic block circuit diagram of the overall circuitry arrangement to operate a discharge lamp.

The overall circuit is shown, highly simplified and schematically, in FIG. 1. A direct current energy source $U_{Batt}$ is coupled to a switched mode power supply SNT, which is connected to an inverter WR; the inverter WR is connected to an ignition circuit ZG for the lamp L, which is connected to the ignition circuit. In addition, a control circuit ST is provided which controls the switching characteristics of the switched mode power supply circuit SNT.

In accordance with a feature of the invention, the control circuit, which directly controls the switched mode power supply, is, in turn, controlled by an operation control circuit ADD, which senses the instantaneous power being supplied to the lamp.

The operation control circuit ADD transduces the instantaneous lamp power into a voltage signal which is compared with a reference signal. The resulting comparison control signal is applied to the power supply control circuit ST which, in turn, controls the switching conditions of the switched mode power supply in such a manner that the discharge lamp L, coupled to the output of the switched mode power supply SNT, operates with at least approximately constant electrical power rating.

The direct current source $U_{Batt}$ can be a battery or a rectifier connected to an alternating current supply. The inverter WR is not strictly necessary and may be omitted if the lamp is designed for direct current operation.

The switched mode power supply SNT, as well as the inverter circuit WR, are well known and described, for example, in the referenced publication by Siemens AG, Bereich Bauelemente, "Switched-Mode Power Supplies" (SMPS), No. 5, page 12, see article entitled "Full-Bridge Push-Pull Converter". A suitable ignition circuit ZG for use in the system of the present invention is described in the article "Electronic Ballasts for Metal Halide Lamps" by H.-J. Fähnrich and E. Rasch in the Journal of the Illuminating Engineering Society, Vol. 17, No. 2 1988, p. 131. Reference may also be had "The Art of Electronics" by P. Horowitz and W. Hill, Cambridge University Press, Cambridge 1980, p. 241, with respect to circuitry and how to obtain signals in the circuits.

Figure 2:
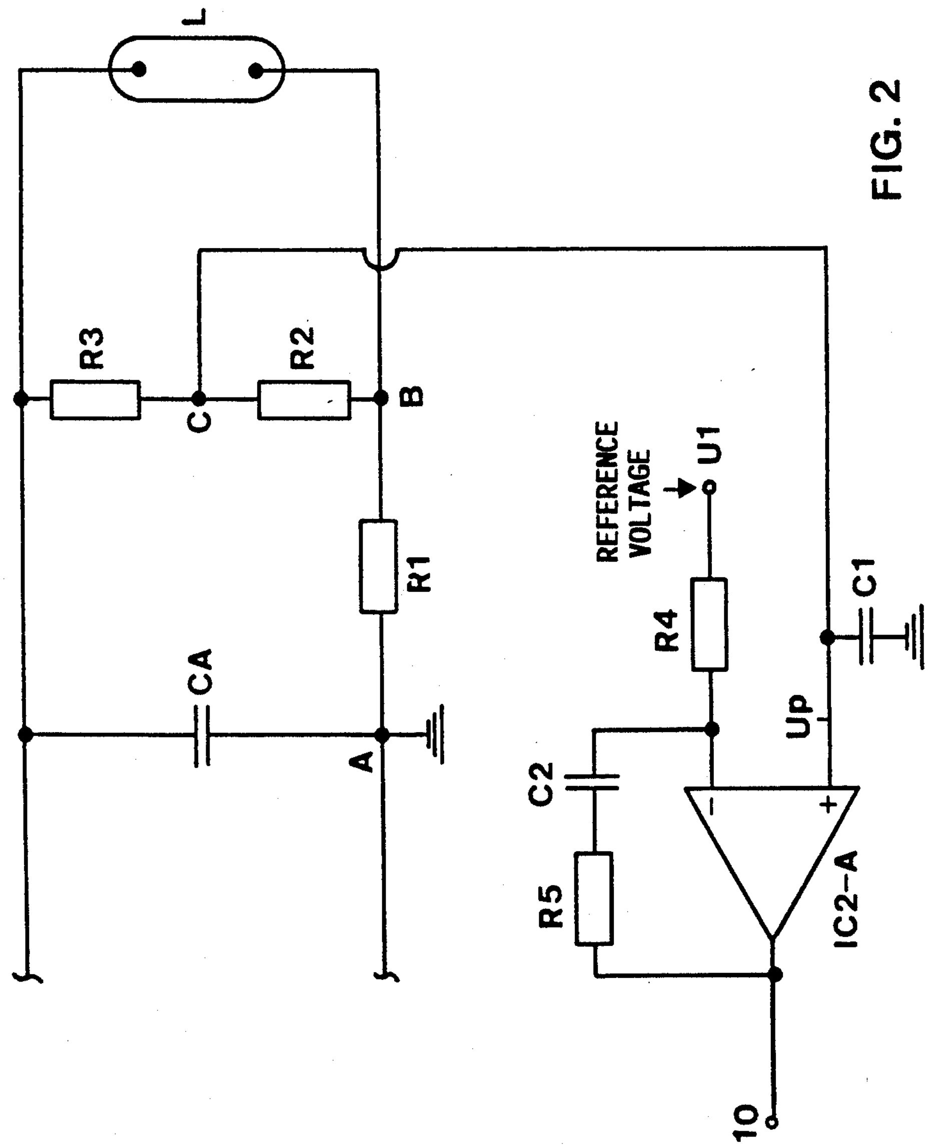
FIG. 2 is a detailed circuit of the operating circuit in accordance with a first example.

Referring next to FIG. 2, which illustrates, in detail, a first embodiment of the operation control circuit ADD:

An output capacitor CA of the switched mode power supply SNT is shown. The lamp L is a high-pressure discharge lamp having a rated power of 75 W, with an arc voltage of about 85 V.

A first voltage divider R2, R3 is connected in parallel to the lamp L. The resistors R2, R3 are ohmic resistors. A current resistor R1 of low resistance value, preferably in the order of 0.22 ohms, is serially connected with the lamp L. As shown, it is coupled in the ground line of the lamp, between a junction A which is at ground or reference voltage, to the output capacitor CA, and a further junction B, which connects the resistor R1, the resistor R2 and the lamp L.

The voltage divider formed by the resistors R2, R3 has a tap junction C which is connected over a low-pass filter formed by the resistor R2 and capacitor C1 to the direct input of a first operational amplifier IC2-A. The inverting input of the operational amplifier IC2-A is connected over a coupling resistor R4 to a reference voltage U1. The output of the operational amplifier IC2-A is fed back to the inverting input through a resistor R5 and a capacitor C2. The output of the operational amplifier IC2-A is connected to a terminal 10 which, as also seen in FIG. 1, is connected to the power supply control circuit ST which, in turn, controls the operating condition of the switched mode power supply based on the comparison signal derived from the operational amplifier IC2-A.

OPERATION

The current measuring resistor R1 has essentially the entire current flowing to the lamp passing therethrough, due to the relatively high resistance value of R3, which is in the order of 300 ohms. Thus, the voltage drop across the resistor R1 will be essentially entirely proportional to the lamp current. The ohmic resistor R2 of the voltage divider R2, R3 has a voltage thereacross which is proportional to the arc voltage of the lamp. Since the junction A is at ground or reference potential, the voltage drops across the resistors R1 and R2 add, to provide an overall power signal or voltage Up. This voltage signal is applied from the junction C to the direct input of the operational amplifier IC2-A. This voltage is compared with a first reference voltage U1, applied to the inverting input of the operational amplifier, so that the operational amplifier will compare a command or desired voltage value U1 with the actual power signal Up. It operates as a PI, that is, proportional-integral controller.

The output of the first operational amplifier IC2-A is applied via output terminal 10 to the power supply control circuit ST which, in turn, controls the operating characteristics of the switched mode power supply SNT. The operational amplifier also amplifies this comparison signal.

The combined voltage signal Up representative of lamp power or, respectively, the comparison signal with the comparison reference voltage U1, can be used to control the operating point of the operation control circuit ADD and hence used to control lamp power. The operating point of the circuit ADD can be set by suitable selection of the resistor R2 and the reference voltage U1 to a desired value.

Suitable values for the circuit components are listed in Table 1.

TABLE 1

| | |
|---|---|
| R1 | 0.22 |
| R2 | 120 |
| R3 | 300 |
| R4 | 15 kΩ |
| R5 | 56 kΩ |
| CA | 2.2 μF |
| C1 | 100 nF |
| C2 | 22 nF |
| IC2-A | LM358 |
| U1 | 0.4 V |

EMBODIMENT OF FIG. 3

Figure 3:
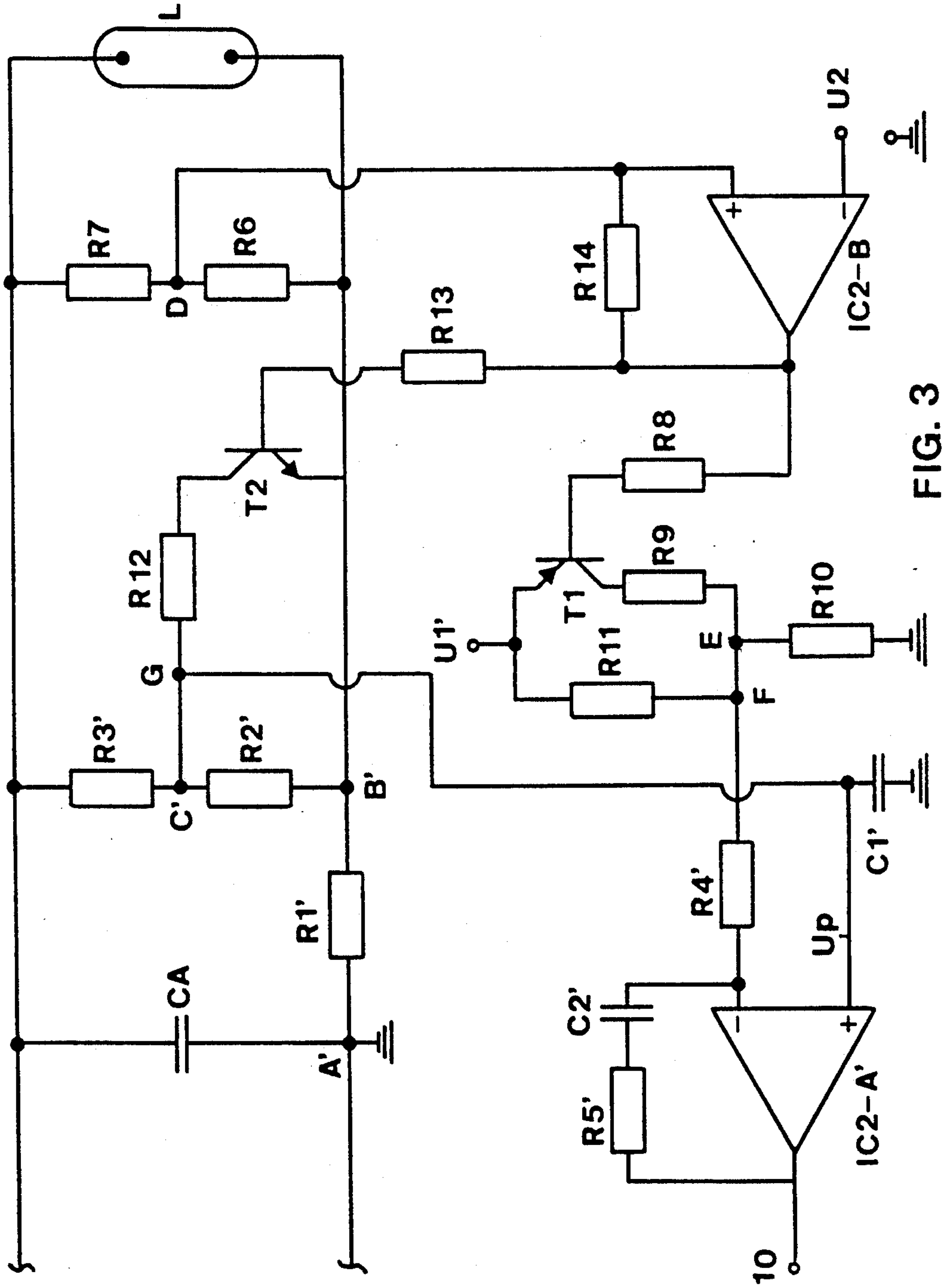
FIG. 3 is a detail of the operating circuit in accordance with a second example, in which compensation for aging and manufacturing tolerances is provided.

The circuit of FIG. 3 is an expansion of the circuit of FIG. 2. All components used in the circuit of FIG. 2 are also used in the circuit of FIG. 3, and have been given the same reference numerals, with prime notation. FIG. 3, also, shows the discharge lamp L and the output capacitor CA of the switched mode power supply SNT.

Two voltage dividers are connected in parallel to the lamp L; a second voltage formed by resistors R6, R7, both ohmic resistors, is connected across the lamp L, or the output capacitor CA, respectively, and formed with a tap or voltage connection junction D. The tap D of the second voltage divider R6, R7 is connected to the direct input of a second operational amplifier IC2-B. The inverting input of the operational amplifier IC2-B is connected to a second reference voltage U2. The output of the second operational amplifier IC2-B is connected over an ohmic coupling resistor R8 to the control electrode of a first transistor switch T1. The first transistor switch T1 is connected with one terminal U1' of the first reference voltage source and, further, over a voltage divider R9, R10, formed of ohmic resistors, with the other terminal of the first reference voltage source, that is, to ground, chassis or reference potential. The junction or tap E of the voltage divider formed by resistors R9, R10 is connected over coupling resistor R4' to the inverting input of the first operational amplifier IC2-A'. A further ohmic resistor R11 is connected in parallel to the resistor R9 and to the transistor switch T1. The resistor R11 is further connected to the junction F which is connected to the junction E and hence to the resistor R4' and the inverting input of the operational amplifier IC2-A'.

An ohmic resistor R12 is connected to the junction C' which in turn is connected to the collector of a second transistor T2. The control electrode of the second switching transistor T2 is connected via resistor R13 to the output of the second operational amplifier IC2-B, to be controlled thereby. The direct input of the second operational amplifier IC2-B is further coupled through resistor R14 to the output of the second operational amplifier IC2-B to form a feedback circuit. The junction G, between the resistor R12 and the tap point C' between the resistors R2' and R3' of the first voltage divider is connected to the direct input of the first operational amplifier IC2-A'.

Representative values of the circuit components of FIG. 3 are listed in Table 2.

TABLE 2

| | |
|---|---|
| R1' | 0.22 Ω |
| R2' | 300 Ω |

TABLE 2-continued

| | |
|---|---|
| R3' | 120 kΩ |
| R4' | 15 kΩ |
| R5' | 56 kΩ |
| R6 | 1.5 kΩ |
| R7 | 300 kΩ |
| R8 | 47 kΩ |
| R9 | 86 kΩ |
| R10 | 1 kΩ |
| R11 | 18 kΩ |
| R12 | 100 kΩ |
| R13 | 47 kΩ |
| R14 | 1 MΩ |
| T1 | BC 327-25 |
| T2 | BC 337-25 |
| C1' | 100 nF |
| C2' | 22 nF |
| IC2-A' | LM 358 |
| IC2-B | LM 358 |
| U1' | 0.4 V |
| U2 | 7.5 V |

OPERATION—CIRCUIT OF FIG. 3

Basically, and in principle, the operation of the circuit is the same as that described in connection with FIG. 2. The expansion of the circuit component ADD by a further operational amplifier IC2-B permits switching the working point of the circuit in dependence on lamp voltage.

If the voltage drop across the resistor R6 is low, transistors T1 and T2 of the circuit block and the operations of the overall circuit will be precisely as that described in connection with FIG. 2. If the voltage drop across the resistor R6 of the second voltage divider R6, R7 reaches a predetermined critical value, the two transistors T1 and T2 will become conductive based on the output signal from the second operational amplifier IC2-B. This connects the resistor R9 in parallel to the resistor R11, and the resistor R12 in parallel to the resistor R2'. The result will be a changed distribution of voltage drops across the resistors R9, R10, R11, so that the reference signal provided to the inverting input of the first operational amplifier IC2-A' will change. Together with the parallel resistor R12, which causes a changed voltage drop across resistor R2', the working point of the overall circuit will change or switch. The change-over or switch-over point is defined by the resistors R6, R7 connected in parallel to the discharge lamp L/as well as by a second reference voltage U2, connected to the inverting input of the second operational amplifier IC2-B.

THIRD EMBODIMENT, FIG. 4

Again, the output capacitor CA of the switched mode power supply SNT is shown. The lamp L is a 170 W high-pressure discharge lamp. Voltage divider R2'', R3'', R3''' is connected in parallel to the lamp L. All resistors are ohmic resistors. A temperature compensated Zener diode DZ, serially connected to a resistor R15, is connected in parallel to the resistors R2'' and R3'' of the voltage divider. This division of the voltage divider into three resistor elements defines two tap points D'' and C''. The junction A'' is connected to a reference potential, for example ground or chassis, and is coupled to the output capacitor CA, the Zener diode DZ, and through an ohmic series resistor R1'' with the junction B'' which, in turn, forms the connection of the discharge lamp L and to the resistor R2''. The tap C'' of the voltage divider R2'', R3'' is connected to the direct input of the operational amplifier IC2-A'', to which, also, a capacitor C1'' is connected. The combination of the resistor R2'' and capacitor C1'' forms an RC low-pass filter to suppress high-frequency interference or disturbance signals.

The inverting input of the operational amplifier IC2-A'' is connected through coupling resistor R4'' to one terminal of the reference voltage source U1''. Further, the output terminal of the operational amplifier IC2-A'' is connected through a feedback series circuit of resistor R5'' and C2'' back to the inverting input.

Numerical values for the various circuit elements, suitable for operating a 170 W high-pressure discharge lamp, are listed in Table 3.

TABLE 3

| | |
|---|---|
| R1'' | 0.11 Ω |
| R2'' | 2.7 kΩ |
| R3'' | 390 kΩ |
| R3''' | 510 kΩ |
| R4'' | 15 kΩ |
| R5'' | 56 kΩ |
| R15 | 680 kΩ |
| C1'' | 100 nF |
| C2'' | 22 nF |
| DZ | ZTK 33 C |
| IC2-A'' | LM 358 |
| U1'' | 0.4 V |

i

OPERATION

Figure 4:
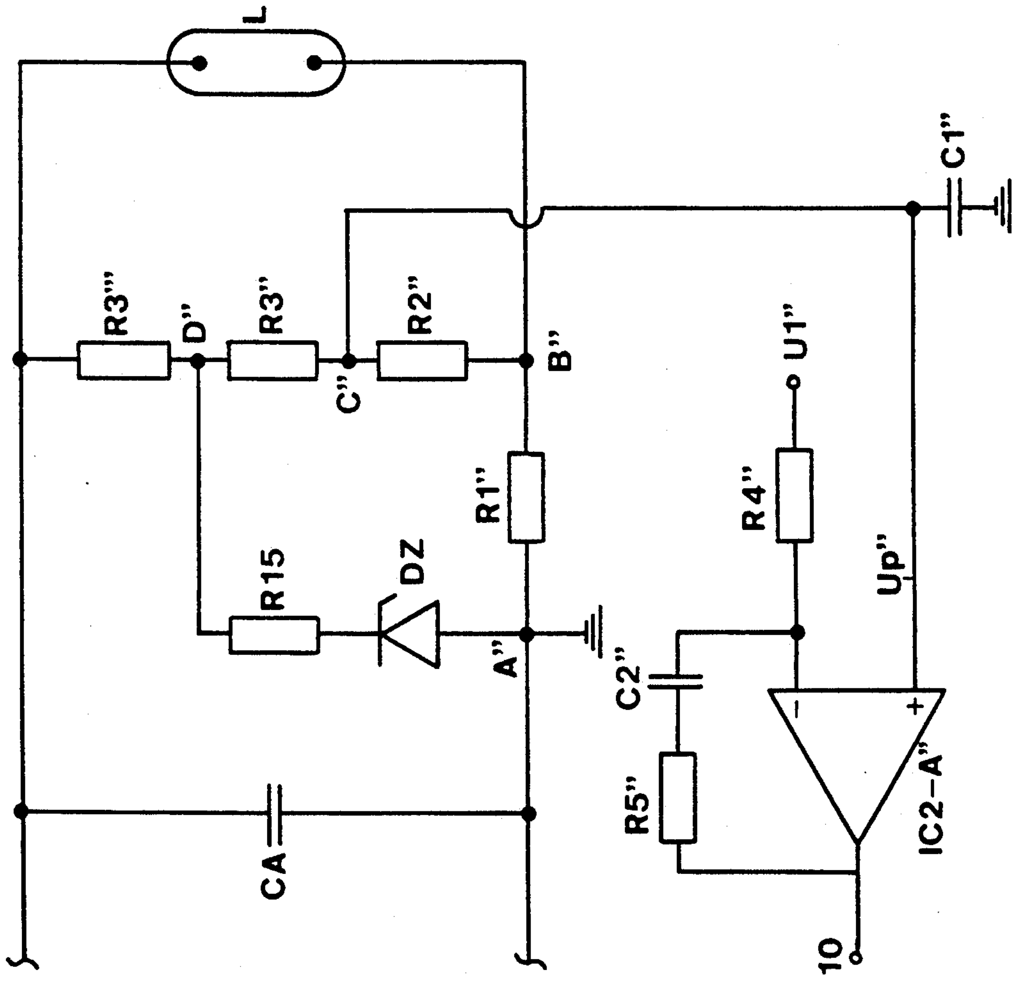
FIG. 4 is a circuit diagram of yet another and third embodiment, likewise providing compensation for aging and lamp tolerances, with minimum circuit and component requirements.

The operating principle of the circuit of FIG. 4 is generally identical to that of the circuit of FIG. 2. The series or current measuring resistor R1'' will carry effectively the entire lamp current, since the resistance of resistors R3'', R3''' is relatively high. Consequently, a voltage drop will occur across the resistor R1'' representative of lamp current. The ohmic resistor R2'' provides for a voltage drop which is effectively proportional to the lamp arc voltage. Since the junction A'' is at reference, ground or chassis potential, the voltage drops at resistors R1'' and R2'' will add, and the resulting sum signal is applied to the direct input of the operational amplifier, signal Up''. The operational amplifier IC2-A'' compares the power signal Up'' with the reference value U1'' and amplifies any difference. The amplified difference or comparison signal is applied at output terminal 10 to the control circuit ST which, in turn, provides for control of the switched mode power supply SNT, for example by controlling the switching clock frequency, duty cycle or the like.

At the predetermined operating point of the circuit, determined by the selection of the resistor R2'' and reference voltage U1'', the overall signal Up'' is proportional to lamp power. Thus, the voltage signal Up'' can be used to control the power consumption of the discharge lamp L.

If a high voltage level should occur, the Zener diode DZ becomes conductive and the resistor R15 will be connected, effectively, in parallel to the resistors R2'' and R3''. This so modifies the voltage at the junction C'' that the signal at the direct input of the operational amplifier IC2-A'' will change and the lamp L will again be controlled for constant power even though the lamp voltage may have become excessive.

It is, of course, readily possible to combine the circuit of FIG. 4 with that of FIG. 3; it is only necessary to replace the resistor R3 of FIG. 3 by two resistors similar to resistors R3''' and R3'' and add the Zener diode DZ—resistors R15 circuit to the resulting additional junction corresponding to junction D''.

Various changes and modifications may be made, and any features described herein may be used with any of the others, within the scope of the inventive concept.

We claim:

1. Operating circuit for a discharge lamp (L) having a switched mode power supply (SNT) coupled to a source of d-c energy ($U_{Batt}$) of varying output voltage, said switched mode power supply delivering d-c output energy changeable within wide limits;

a control circuit (ST) connected to and controlling the switching conditions of the switched mode power supply (SNT); and an ignition circuit coupled to the switched mode power supply and to the lamp (L) for igniting the lamp;

said operating circuit further comprising means for controlling the power consumption of the lamp, during operation thereof, said power consumption control means including an operating control circuit (ADD) which includes lamp voltage sensing means (R2, R3) connected to sense the instantaneous voltage across the lamp, and deriving a voltage signal;

lamp current sensing means (R1) connected to sense the instantaneous electrical current flowing through the lamp and deriving a current signal; and connection means (c) adding the voltage signal and the current signal and providing a power signal;

reference means (U1) providing a preset reference signal;

comparator means (IC2-A) coupled to receive the power signal and further coupled to the reference means, and providing a comparison control signal;

said operation control circuit (ADD) applying said comparison control signal to the switched mode power supply (SNT) for controlling the switching conditions thereof in accordance with said comparison control signal.

2. The circuit of claim 1, wherein said current sensing means comprises a current resistor ($R_1$) serially connected with an electrode of said lamp (L) for delivering the voltage signal representative of lamp current, and said voltage sensing means (R2, R3) is coupled to the current resistor (R1), and includes the connection means and delivers a composite addition signal ($U_p$) representative of power supplied to the lamp, and adding the voltage signal to the current signal.

3. The circuit of claim 1, wherein said voltage sensing means comprises at least a first voltage divider (R2, R3: R2', R3'; R2", R3") connected in parallel to the discharge lamp (L), and the current sensing means comprises a current measuring resistor (R1; R1', R1") serially connected with the lamp, and connected by said connection means (c) to provide a composite addition signal; and said comparator means comprises at least one first operational amplifier (IC2-A, IC2-A', IC2-A"), connected for comparing said composite addition signal with a reference voltage derived from said reference means and furnishing said comparison control signal as a function of the difference between said composite addition signal and said reference signal for application to said switched mode power supply (SNT).

4. The circuit of claim 3, wherein said operation control circuit (ADD) includes a further operational amplifier (IC2-B) connected in cascade with the at least one first operational amplifier (IC2-A'), and receiving a reference signal (U2) at one input, and a further voltage divider (R6, R7), the further voltage divider being connected in parallel to the discharge lamp (L);

and at least one semiconductor switch (T1) coupled to said further voltage divider.

5. The circuit of claim 4, wherein said further operational amplifier (IC2-B) is connected as a comparator, receiving the reference signal at one input, and a voltage tap signal from said further voltage divider (R6, R7) and providing a difference output signal;

two active semiconductor switches (T1, T2) are provided, controlled by the output signal from said further operational amplifier;

one of the semiconductor switches (T2) being connected in parallel to one (R2') of the resistors of the first voltage divider (R2', R3'), and the second of the semiconductor switches (T1) being coupled to the inverting input of said first operational amplifier (IC2-A), to change the working point of the operation control circuit (ADD) as a function of voltage in dependence on instantaneous lamp voltage.

6. The circuit of claim 5, further including a feedback resistor (R14) coupling the output of the second operational amplifier (IC2-B) to the direct input thereof.

7. The circuit of claim 3, wherein said operation control circuit further includes a passive semiconductor switch (DZ) connected in parallel to the discharge lamp (L) and to a portion of said voltage divider (R2", R3").

8. The circuit of claim 7, wherein said passive semiconductor switch (DZ) comprises a temperature compensated Zener diode (DZ).

9. The circuit of claim 3, further including a feedback circuit comprising an RC circuit interconnecting the inverting input of the first operational amplifier (IC2-A, IC2-A', IC2-A") to the output thereof.

10. The circuit of claim 3, further including a low-pass filter (R2, C1, R2', C1', R2", C1") connected to the direct input of the first operational amplifier (IC2-A, IC2-A', IC2-A").

11. The circuit of claim 10, wherein said low-pass filter comprises an RC filter.

12. The circuit of claim 11, wherein the resistor component of said RC filter is formed by one of the resistors (R2, R2', R2") of said voltage divider (R2, R3; R2', R3'; R2", R3"). )

* * * * *